(12) United States Patent
Japp et al.

(10) Patent No.: US 7,381,587 B2
(45) Date of Patent: Jun. 3, 2008

(54) METHOD OF MAKING CIRCUITIZED SUBSTRATE

(75) Inventors: Robert M. Japp, Vestal, NY (US); John M. Lauffer, Waverly, NY (US); Voya R. Markovich, Endwell, NY (US); William E. Wilson, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 302 days.

(21) Appl. No.: 11/324,432

(22) Filed: Jan. 4, 2006

(65) Prior Publication Data

US 2007/0166944 A1    Jul. 19, 2007

(51) Int. Cl.
*H01L 21/00*        (2006.01)
(52) U.S. Cl. ............... 438/107; 438/106; 257/E21.122
(58) Field of Classification Search ............... 438/106, 438/107; 257/E21.122
See application file for complete search history.

(56) References Cited

U.S. PATENT DOCUMENTS

| | | | |
|---|---|---|---|
| 5,229,550 A | 7/1993 | Bindra et al. | |
| 5,334,487 A | 8/1994 | Kindl et al. | |
| 5,384,433 A | 1/1995 | Osann, Jr. et al. | |
| 5,418,689 A | 5/1995 | Alpaugh et al. | |
| 5,448,020 A | 9/1995 | Pendse | |
| 5,588,207 A | 12/1996 | Kawakita et al. | |
| 5,685,070 A | 11/1997 | Alpaugh et al. | |
| 5,822,856 A | 10/1998 | Bhatt et al. | |
| 5,912,809 A | 6/1999 | Steigerwald et al. | |
| 6,204,453 B1 | 3/2001 | Fallon et al. | |
| 6,249,045 B1* | 6/2001 | Kresge et al. | ............... 257/678 |
| 6,288,906 B1 | 9/2001 | Sprietsma et al. | |
| 6,562,654 B2* | 5/2003 | Kresge et al. | ............... 438/106 |
| 6,826,830 B2* | 12/2004 | Egitto et al. | ................... 29/852 |
| 6,931,723 B1* | 8/2005 | Powell | ........................ 29/852 |
| 7,335,521 B2* | 2/2008 | Dubs et al. | .................... 438/22 |
| 2004/0089471 A1 | 5/2004 | Andoh et al. | |

FOREIGN PATENT DOCUMENTS

EP    1 583 108 A1    5/2005
JP    2004153000    5/2004

* cited by examiner

*Primary Examiner*—Seahvosh J Nikmanesh
(74) *Attorney, Agent, or Firm*—Hinman, Howard & Kattell LLP; Lawrence R. Fraley; Mark Levy

(57) ABSTRACT

A method of making a circuitized substrate and an electrical assembly utilizing same in which the substrate is comprised of at least two sub-composites in which the dielectric material of at least one of these sub-composites is heated during bonding (e.g., lamination) to the other sufficiently to cause the dielectric material to flow into and substantially fill openings in a conductive layer for the bonded structure. Conductive thru-holes are formed within the bonded structure to couple selected ones of the structure's conductive layers. Formation of an electrical assembly is possible by positioning one or more electrical components (e.g., semiconductor chips or chip carriers) on the final structure and electrically coupling these to the structure's external circuitry.

12 Claims, 3 Drawing Sheets

METHOD OF MAKING CIRCUITIZED SUBSTRATE

TECHNICAL FIELD

This invention relates to methods of making circuitized substrates and particularly to those used in multilayered printed circuit boards, chip carriers, and the like.

CROSS REFERENCE TO CO-PENDING APPLICATIONS

In Ser. No. 10/882,167, filed Jul. 2, 2004, there is defined a circuitized substrate which includes a plurality of contiguous open segments which define facing edge portions within an electrically conductive layer to isolate separate portions of the conductive layer such that the layer can be used for different functions, e.g., as both power and ground elements, within a product (e.g., electrical assembly) which includes the substrate as part thereof. A method of making the substrate, an electrical assembly utilizing the substrate, a multilayered circuitized assembly also utilizing the substrate and an information handling system, e.g., a mainframe computer, are also provided. Ser. No. 10/882,167 is now U.S. Pat. No. 7,157,646.

In Ser. No. 10/882,170, also filed Jul. 2, 2004, there is defined a circuitized substrate which includes a plurality of contiguous open segments along a side edge portion of the at least one electrically conductive layer thereof, these open segments isolated by a barrier of dielectric material which substantially fills the open segments, e.g., during a lamination process which bonds two dielectric layers of the substrate to the conductive layer. A method of making the substrate, an electrical assembly utilizing the substrate, a multilayered circuitized assembly also utilizing the substrate and an information handling system, e.g., a mainframe computer, are also provided. Ser. No. 10/882,170 is now U.S. Pat. No. 7,157,647.

Both of the above applications are assigned to the same Assignee as the present invention.

BACKGROUND OF THE INVENTION

Many of today's multilayered printed circuit boards (hereinafter also referred to as PCBs), laminate chip carriers, and the like require the formation of multiple circuits in a minimum volume or space. These structures typically comprise a stack of layers of signal, ground and/or power planes separated from each other by a layer of dielectric material. Selected ones of the conductive planes may be in electrical contact with one another, typically using plated (e.g., with copper) holes (openings) which pass through intervening dielectric layers. The plated holes are often referred to as "vias" if internally located, "blind vias" if extending a predetermined depth within the board from an external surface, or "plated thru-holes" (PTHs) if extending substantially through the board's full thickness. By the term "thru-hole" as used herein is meant to include all three types of such substrate openings.

Known methods of fabricating PCBs, chip carriers and the like typically comprise fabrication of separate inner-layer circuits (circuitized layers), which are formed by coating a photosensitive layer or film over a copper layer of a copper clad inner-layer base material. The photosensitive coating is imaged, developed and the exposed copper is etched to form conductor lines. After etching, the photosensitive film is stripped from the copper leaving the circuit pattern on the surface of the inner-layer base material. This processing is also referred to as photolithographic processing in the PCB art and further description is not deemed necessary.

After individual inner-layer circuits are formed, a multilayer stack is formed by preparing a lay-up of inner-layers, ground planes, power planes, etc., typically separated from each other by a layer of dielectric pre-preg material, the latter usually comprising a layer of glass (typically fiberglass) cloth impregnated with a partially cured material, typically a B-stage epoxy resin. Such material is also known as "FR4" material for its flame retardant (FR) rating. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in this copper cladding using procedures similar to the procedures used to form the inner-layer circuits. That is, a photosensitive film is applied to the copper cladding, exposed to patterned activating radiation and developed (removed). An etchant is then used to remove copper bared by the development of the photosensitive film. Finally, the remaining photosensitive film is removed to provide the exterior circuit layers.

Electrically conductive thru-holes (or interconnects) as described above are used to electrically connect individual circuit layers within the structure to each other and to the outer surfaces, and typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outer layers are formed using the procedure described above.

Chips and/or other electrical components are next mounted on one or both of the external surfaces of the multilayer structure, typically using solder mount pads and solder balls to bond the components to the PCB. The result is a substrate and component structure which may also be referred to as an electrical assembly. The components are often in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photo-imageable solder mask may be coated onto the board and exposed and developed to yield an array of openings defining the pads. The openings are then coated with solder using processes known to the art such as wave soldering.

The complexity of products of this type has increased significantly over the past few years. For example, PCBs for mainframe computers may have as many as thirty-six layers of circuitry or more, with the complete stack having a thickness of as much as about 0.250 inch (250 mils). These boards are typically designed with three to five mil wide signal lines and ten to twelve mil diameter thru-holes. For increased circuit densification in many of today's electronic products such as PCBs, chip carriers and the like, the industry seeks to reduce signal lines to a width of two mils or less and thru-hole diameters to two mils or less. A few of these products are available today with more in demand.

Examples of various circuitized substrates and methods of making same are further described in the documents listed below.

In U.S. Pat. No. 6,288,906, issued Sep. 11, 2001, there is described a method of making a multi-layer PCB that includes power planes for its outer conductive layers. The outer conductive layers are patterned to accept circuitry, such as integrated circuits and surface mount devices. Mounting pads are provided on the outer conductive layers which include plated-through vias (holes) for electrical interconnection with other conductive layers of the board.

In U.S. Pat. No. 6,204,453, issued Mar. 20, 2001, there is described a method of forming a PCB with a metal layer which serves as a power plane sandwiched between a pair of photo-imageable dielectric layers. Photo-formed metal filled vias and photo-formed plated through holes are in the photo-patternable material, and signal circuitry is on the surfaces of each of the dielectric materials and connected to the vias and plated through holes. A border may be around the board or card including a metal layer terminating in from the edge of one of the dielectric layers. A copper foil is provided with clearance holes. First and second layers of photo-imageable curable dielectric material are located on opposite sides of the copper. The patterns are developed on the first and second layers to reveal the metal layer through vias. At the clearance holes in the copper, through holes are developed where holes were patterned in both dielectric layers. Thereafter, the surfaces of the photo-imageable material, vias and through holes are metallized by copper plating. This is preferably done by protecting the remainder of the circuitry with photo-resist and utilizing photolithographic techniques. The photo-resist is thereafter removed, leaving a circuit board or card having metallization on both sides, vias extending from both sides to the copper layer in the center, plated through holes connecting the two outer circuitized copper layers.

In U.S. Pat. No. 5,912,809, issued Jun. 15, 1999, the electrical potentials and very high frequency (VHF) currents in a circuit board are controlled by patterning the power plane of a multiple layered, capacitive plane printed circuit board in selected geometric patterns. The selected geometric patterns, both simple and complex, control voltages and currents by channeling the capacitance capacity for usage directed to a particular integrated circuit or circuits, isolated to a particular integrated circuit or circuits, or shared between integrated circuits.

In U.S. Pat. No. 5,822,856, issued Oct. 28, 1998, there is described a process wherein circuit boards are manufactured by forming a substrate with a dielectric surface, laminating a metal foil and a peelable film to the substrate, and forming holes in the substrate through the peelable film and foil. A filler material with an organic base may be filled with electroconductive particles or dielectric thermoconductive particles. The filler material is laminated onto the peelable film with sufficient heat and pressure to force the filler material to fill the holes. For thermoconductive filler, the holes are filled sufficient for electrical connection through the holes. The filler material is abraded to the level of the foil and is then copper plated. The copper is patterned to form a wiring layer. A permanent dielectric photoresist layer is formed over the wiring layer, and via holes are formed through the photoimageable dielectric over pads and conductors of the wiring layer. Holes are formed through the substrate and the photoimageable dielectric, walls of the via holes, and walls of the through holes are copper plated. The copper plating on the photoimageable dielectric is patterned of form an exterior wiring layer. Components and/or pins are attached to the surface of the circuitized substrate with solder joints to form a high density circuit board assembly.

In U.S. Pat. No. 5,685,070, issued Nov. 11, 1997, there is described a method of making a printed circuit board or card for direct chip attachment that includes at least one power core, at least one signal plane that is adjacent the power core, and plated thru-holes for electrical connection is provided. In addition, a layer of dielectric material is adjacent the power core and a circuitized conductive layer is adjacent the dielectric material, followed by a layer of photosensitive dielectric material adjacent the conductive layer. Photodeveloped blind vias for subsequent connection to the power core and drilled blind vias for subsequent connection to the signal plane are provided.

In U.S. Pat. No. 5,448,020, issued Sep. 5, 1995, there is described a system and method for providing a controlled impedance flex circuit which includes providing an insulative flexible substrate having opposed first and second surfaces and having through holes extending from the first surface to the second surface. A pattern of conductive traces is formed on the first surface of the flexible substrate. A film of conductive adhesive is applied to the second surface and to the through holes. The through holes are aligned to contact ground traces in the pattern of conductive traces on the first surface. Thus, a ground plane is established for creating an environment for high frequency signal propagation. The conductive adhesive may be a b-stage epoxy or a thermoplastic material. In the preferred embodiment, a tape automated bonding frame is fabricated.

In U.S. Pat. No. 5,418,689, issued May 23, 1995, there is described a method of making a printed circuit board for direct chip attachment that includes at least one power core, at least one signal plane adjacent the power core, and plated thru-holes for electrical connection. In addition, a layer of dielectric material is adjacent the power core and a circuitized conductive layer is adjacent the dielectric material, followed by a layer of photosensitive dielectric material adjacent the conductive layer.

In U.S. Pat. No. 5,384,433, issued Jan. 24, 1995, there is described a method of making a PCB that includes an array of conductive pads including component-mounting holes disposed on first and second surfaces thereon. An array of conductive attachment lands arranged in pairs of first and second attachment lands are disposed on the first and second surfaces. The first and second attachment lands are insulated from one another and separated by a distance selected to allow attachment of standard sized components therebetween on the first and second surfaces of said circuit board. First and second conductive power distribution planes are disposed on the first and second surfaces and are insulated from the conductive pads and the second attachment lands disposed thereon.

In U.S. Pat No. 5,334,487, issued Aug. 2, 1994, there is described a method of forming a pattern of conductive material on dielectric material with access openings or vias through said dielectric material and such a structure. A sheet of conductive material, which is to be circuitized, is provided with a layer of a first photo-imageable dielectric material on one face thereof. A layer of a second photo-imageable material, such as a conventional photo-resist material, is provided on the opposite face of the conductive material. The layer of said first photo-imageable material is selected such that it will not be developed by the developer that develops the layer of said second material. The two layers of photo-imageable material are pattern-wise exposed to radiation. The second layer of material is developed and the revealed underlying conductive material is etched to form the desired circuit pattern. The first layer is then developed to form openings or vias communicating with the circuit pattern, and these are then filled with a conductive material such as solder.

In U.S. Pat. No. 5,229,550, issued Jul. 20, 1993, there is described a structure and method for making a high density circuit board. Using photosensitive or other dielectric materials over a circuitized power core, vias and lands are opened up, filled with joining metal and aligned with the next level, eliminating a major registration problem in building up a high density composite and reducing the number of steps in the manufacturing process.

As described herein, the present invention represents a significant improvement over known processes, including those described above, used in the production of multilayered circuitized substrates such as PCBs. One particularly significant feature of this invention is the use of two facing sub-composites which, when bonded together, form a common conductive layer with filled (with dielectric material) openings therein. These filled openings may then be drilled out and formed into conductive openings. Other highly advantageous features of this invention are discernible from the following description.

It is believed that such an invention will represent a significant advancement in the art.

OBJECTS AND SUMMARY OF THE INVENTION

It is a primary object of this invention to enhance the circuitized substrate art.

It is another object of the invention to provide a method of making a circuitized substrate which may be performed using conventional processes known in the art and which is thus relatively easy and inexpensive to implement.

It is another object of this invention to provide various structures which are adaptable for utilizing a substrate so formed by the method taught herein and which thus possess the significant advantages taught herein.

According to one aspect of the invention, there is provided a method of making a circuitized substrate which comprises forming a first sub-composite including a first dielectric layer of a partially cured dielectric material and having first and second electrically conductive layers positioned on opposite sides thereof, the second electrically conductive layer including a plurality of openings therein, forming a second sub-composite including a second dielectric layer having a third electrically conductive layer positioned thereon, aligning the first and second sub-composites such that the second electrically conductive layer of the first sub-composite including said plurality of openings therein faces the second dielectric layer of the second sub-composite, bonding the two sub-composites together using pressure and heat sufficient to substantially fully cure the partially cured dielectric material of the first dielectric layer and also to cause this dielectric material to substantially fill the plurality of openings within the second electrically conductive layer. The method further includes the step of forming conductive openings within the bonded first and second sub-composites to provide electrical connections between selected ones of the first, second and third conductive layers.

BEST MODE FOR CARRYING OUT THE INVENTION

For a better understanding of the present invention, together with other and further objects, advantages and capabilities thereof, reference is made to the following disclosure and appended claims in connection with the above-described drawings. Like numerals will be used to identify like elements from FIG. to FIG.

By the term "circuitized substrate" as used herein is meant to include multilayered structures having a plurality of dielectric layers and a plurality of electrically conductive layers arranged in an alternating manner. Examples of dielectric materials usable for the dielectric layers include fiberglass-reinforced epoxy resins (sometimes referred to as "FR4" dielectric material in the art), polytetrafluoroethylene (e.g., Teflon), polyimides, polyamides, cyanate resins, photo-imageable materials, and other like materials. The conductive layers for such substrates are metal and may function in various conductive capacities (e.g., as power, signal and/or ground planes) in the final product. Examples of metals for such layers include copper and copper alloys, but may include additional metals (e.g., nickel, aluminum, etc.) or alloys thereof. Further examples will be described in greater detail herein-below. Examples of circuitized substrates include the aforementioned printed circuit boards (or cards) and chip carriers. It is believed that the teachings of the instant invention are also applicable to what are known as "flex" circuits (which use dielectric materials such as polyimide).

By the term "sub-composite" as used herein is meant to include a structure comprised of at least one dielectric layer and, in one example, at least two outer conductive layers. In simplest form, such a sub-composite may include but one conductive layer.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products typically include suitable housings, as are known, in which are positioned one or more circuitized substrates. In one know example, a "motherboard" (e.g., a large PCB) is utilized and includes one or more smaller circuit boards or cards coupled thereto, each of the smaller cards or boards in turn having selected electronic components such as resistors, capacitors, modules, etc. thereon, depending on the operational requirements of such a system.

Figure 1:
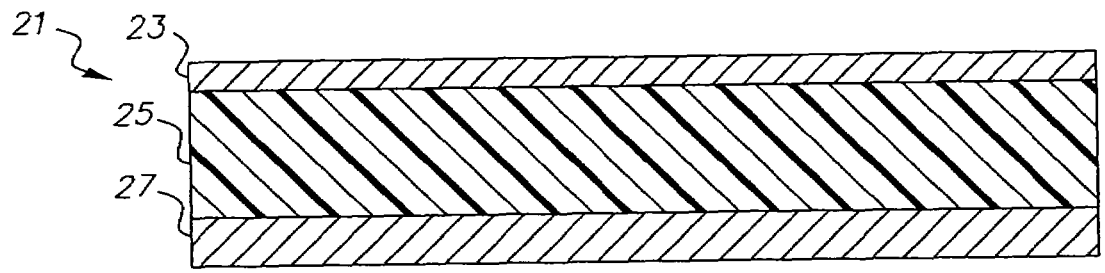
FIGS. 1-5 are side elevational views, in section, which illustrate the steps to make a circuitized substrate according to one embodiment of the invention.

In FIG. 1, there is shown a step in producing a circuitized substrate according to one embodiment of the invention. In this step, a "sub-composite" member 21 comprised of a first conductive layer 23 (preferably copper or copper alloy) of substantially planar and rectangular shape (as shown), a dielectric layer 25 of dielectric material such as described above, and a second conductive layer 27 (also preferably copper or copper alloy), is provided. One other example of a dielectric material capable of being used in this invention is described in U.S. Pat. No. 7,270,845, entitled, "Dielectric Composition For Forming Dielectric Layer For Use In Circuitized Substrates" (inventors: R. Japp et al). Still another material which can be used for layer 25 is a polymer material known in the industry as Driclad dielectric material, a material produced and sold by the Assignee of the present invention. (Driclad is a registered trademark of Endicott Interconnect Technologies, Inc.) In one example, layer 23 may be 0.5 mils thick (a mil being one thousandths of an inch), layer 25 may be 3.0 mils thick, and layer 27 may be 0.5 mils thick. Significantly, the dielectric material of layer 25 is not fully cured, and in one example, at a condition known in the art as "B-stage." This stage of partial cure is known for many examples of dielectric materials, especially the aforementioned fiberglass-reinforced epoxy resin known also as "FR4" material, when such materials are being used in PCB manufacturing. Of further significance, both conductive layers 23 and 27 are bonded to the interim dielectric layer 25 using a low temperature lamination process or a vacuum lamination process. In either case, the temperature of the process is low enough so as not to affect (further cure) the B-staged material's flow properties. That is, these properties are not significantly advanced, such that the dielectric material remains at partial cure. In one example, this lamination may occur at a temperature within the low range of from about 75 degrees C. to about 130 degrees C. and at a pressure of from only about five p.s.i. to about fifty p.s.i. This structure is thus bonded together without using a conventional lamination press and the high temperatures and pressures associated therewith.

Figure 2:
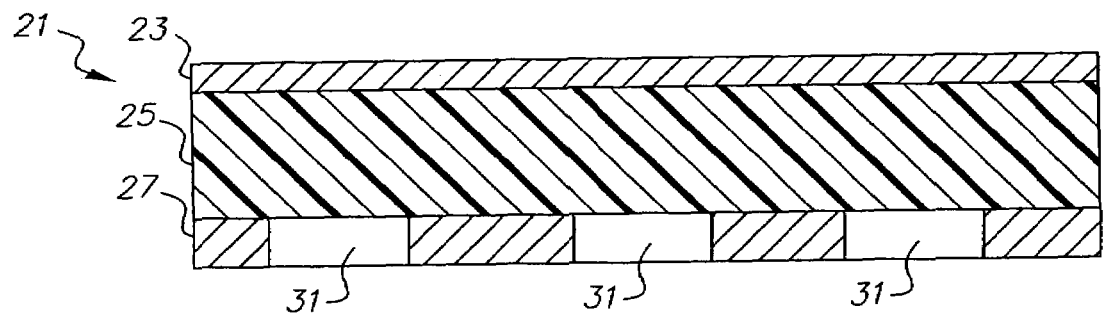

In FIG. 2, layer 27 is shown as being provided with a plurality of openings 31 therein. In one embodiment, openings are intended to be "clearance" openings to enable formation of conductive thru-holes (see below) through the openings but not in electrical contact with the conductive layer. This is desired if layer 27 is to be a power layer (plane) within the final circuitized substrate, as is the case for the embodiment shown herein. In one example, a total of 20,000 openings 31, each including a diameter of ten mils, may be provided in layer 27, and spaced apart at distances ranging from about five mils to about twenty mils. The preferred means of forming openings 31 is to use known photolithographic processing in which a photo-resist is deposited on the layer's exposed surface, exposed according to the desired opening pattern, and then developed (removed to expose the copper which will be etched away to form the openings). Any suitable etchant may be used, one example being cupric chloride, and may be applied using conventional etching apparatus used in PCB manufacturing.

As mentioned above, miniaturization is a highly sought after feature for many of today's circuitized substrates, with increasing demands being made for higher density circuit lines, pads, PTHs, etc. As part of this, it is also desirable to provide power and other internal layers (planes) such as layer 27 of a thinner configuration than normally utilized in current PCB and other circuitized substrate products. Such reduction in thickness for such a layer is extremely difficult to attain, however, because of the subsequent processing that the layer is subjected to, perhaps the most extreme being the high temperatures and pressures associated with lamination in which the sub-composite is aligned and bonded to other sub-composites, layers, etc. to form a final, multilayered structure (e.g., PCB). Heretofore, a typical layer intended for a power or the like internal plane often needed to be of what is called "one ounce" copper, meaning it had to have a thickness of at least about 1.4 mils. As understood from the above, the conductive layer 27 of this invention is of lesser thickness, and, because of the unique teachings of this invention, is able to be readily processed further, including using high temperature and pressure lamination processing such as currently used in the art. This is made possible because the "B-stage" dielectric and the bonded second conductive layer 23 provide support for layer 27, in the manner defined in greater detail below.

Figure 3:
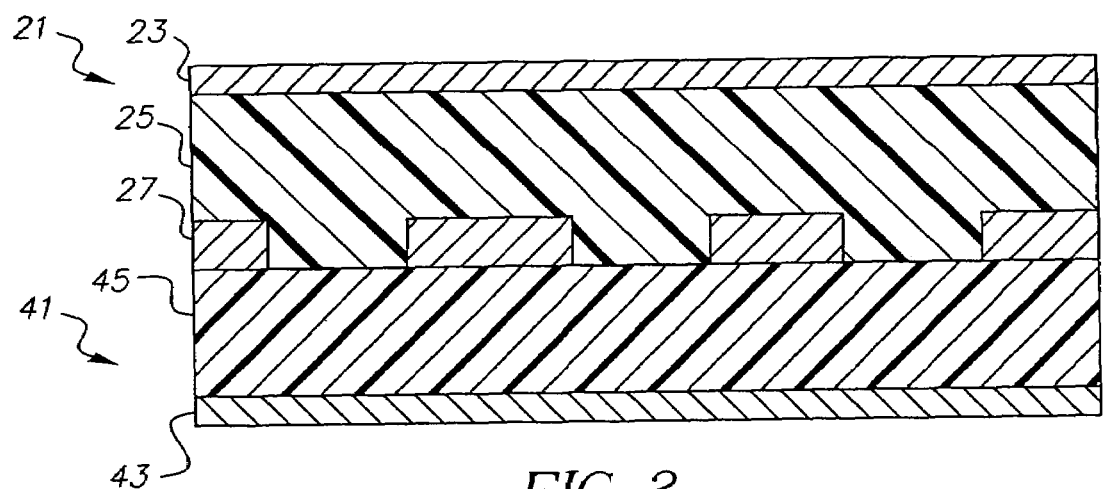
Figure 4:
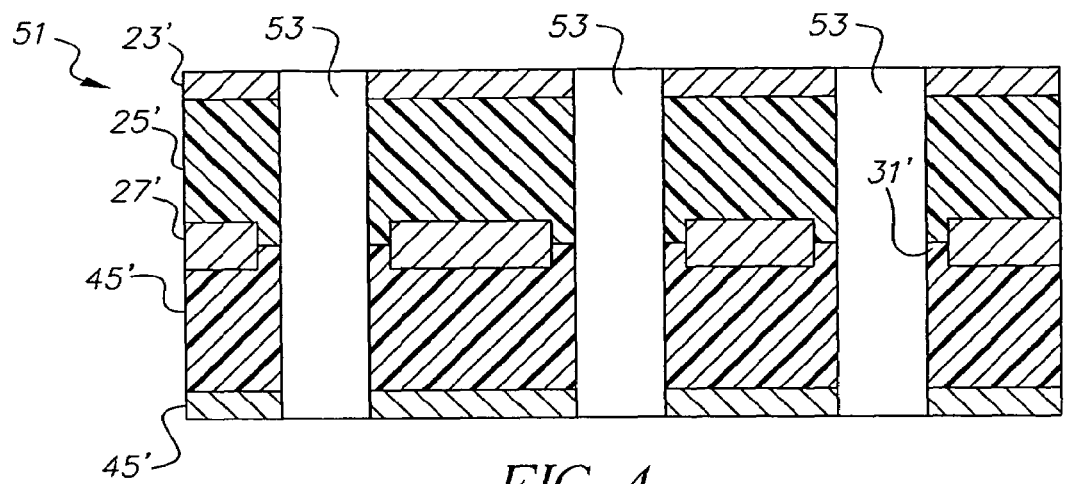

In FIG. 3, sub-composite 21 is aligned with a second sub-composite 41 comprised of a conductive layer 43 and bonded dielectric layer 45, with the layer 27 of sub-composite 21 facing and contacting the dielectric layer 45. The conductive layer 43 of sub-composite 41 is also preferably copper, and may have a thickness of about 0.5 mils. Dielectric layer 45 may be of the same material as that of layer 25, and may be also in "B-stage" condition, albeit this is not necessary to attain the advantages taught herein. In FIG. 3, both sub-composites are now bonded together, preferably using conventional PCB lamination apparatus and processing. In one example, temperatures within the range of about 180 degrees C. to about 220 degrees C. and pressures within the range of about 100 p.s.i. to about 1200 p.s.i. may be used. It is seen that these are significantly greater than the temperatures and pressures associated with the aforementioned bonding process for sub-composite 21. Significantly, these relatively high temperatures serve to accomplish at least two things: (1) cause the dielectric material of layer 25 (and that of layer 45 if layer 45 is also at "B-stage" at this time) to flow into the openings 31 of layer 27 and substantially fill these openings; and (2) fully cure the dielectric material(s). If layer 45 is at full cure during this lamination at such relatively high temperatures, it will not flow and will instead remain somewhat in its original position, this being illustrated in FIG. 3 because only material 25 is shown therein as filling openings 31. If layer 45's material is at "B-stage", however, openings 31 will be substantially filled from opposite ends thereof. The illustrated line of demarcation shown in FIG. 4 is intended to better show this opposed filling. (Such filling is also shown for the embodiments subsequently described in FIGS. 5 and 6.) With opposed filling, such a line will not likely occur because of a "blending" of the two dielectric materials, especially should both be of similar composition. The demarcation line is thus shown for illustrative purposes only, in the usual embodiments. In one example, the final bonded composite structure shown in FIG. 3 will possess an overall thickness of only about four mils to about ten mils. As understood, all dielectric material in this composite is now fully cured.

Prior to the above lamination of sub-composites 21 and 41, it may be desirable to treat the outer surfaces of layer 27 to promote bonding to the dielectric material. One example of such a process is a chemical treatment process in which the exposed external surface is exposed to a solution containing acid, peroxide and a metal (preferably, copper), one known solution of this type being referred to as "BondFilm" solution which is currently available under this name from Atotech Deutschland GmbH, an international company having a U.S.A. business address at 1750 Overview Drive, Rock Hill, S.C. ("BondFilm" is a trademark of Atotech Deutschland GmbH.) This BondFilm solution is comprised primarily of three components: (1) sulfuric acid; (2) hydrogen peroxide; and (3) copper, as well as additional Atotech Deutschland GmbH proprietary constituents. This process is also referred to as an "oxide alternative process", meaning that it does not result in the formation of oxide layers on the treated material. The conductive layer 27 is treated with this BondFilm solution, e.g., by immersion for a period of from about 30 to about 200 seconds at a solution temperature of about 25 to 45 degrees Celsius (C.). As part of this treatment, conductive layer 27 is initially cleaned and degreased, followed by an activation step, following which a micro-etch of the exposed surfaces occurs. Finally, a very thin organic layer (or coating), not shown, is applied. Significantly, this thin organic layer remains on the conductive layer when the layer is bonded to sub-composite 41. In one example, a preferred organic material for this layer is benzotriazole with a thickness only from about 50 Angstroms to about 500 Angstroms. Treatment of the copper layer using the above process results in an RMS roughness increase for the conductive layer's outer surfaces of from about 0.1 microns to about 0.5 microns, such that the subsequent lamination to the described dielectric layer results in sound adhesion between both conductive and dielectric layers.

In FIG. 4, there is shown a composite substrate 51 similar to that shown in sub-composite form in FIG. 3 (noting the slight difference in representative demarcation in the center portion, as mentioned above, because in this embodiment the lower sub-composite dielectric material is also shown to have intruded within the openings, now represented by numerals 31', of the inner conductive layer, now represented by the numeral 27'). Substrate 51 includes the internal conductive layer 27' with its plurality of openings 31' therein, outer conductive layers 23' and 45', respectively, and, of course, the interim, combined dielectric material 25' and 45'. Substrate 51 is now drilled (preferably using mechanical or laser drilling) to form openings 53 which extend entirely through the substrate's thickness, including through the outer conductive layers. Notably, these openings 53 do not contact the interior conductive surfaces of layer 27', and thus only include dielectric material for the walls thereof. Alternatively, it is possible to contact interim layer 27' and eventually form an electrical connection therewith, e.g., should layer 27' be used as a signal layer, or perhaps as a ground and it is desired to ground one or more other parts of the substrate's circuitry thereto.

Figure 5:
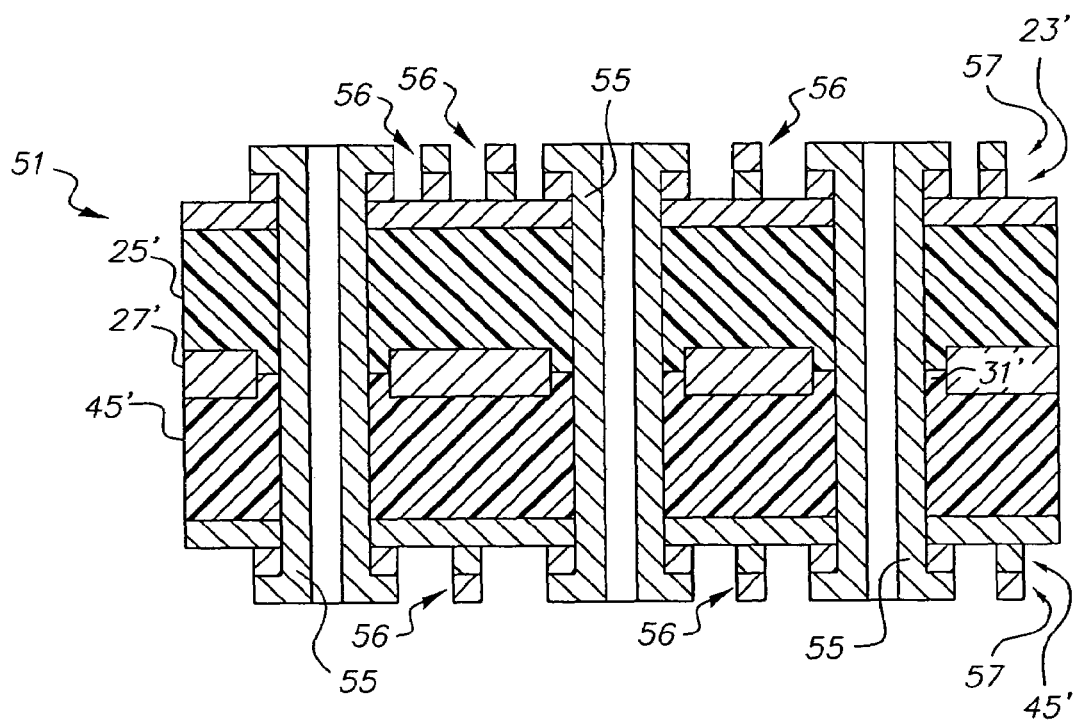

Once openings 53 are formed (in one example, these may include a diameter of only about two mils), these are now rendered conductive, preferably by plating the internal surfaces thereof with at least one conductive layer 55, a preferred conductor for such layers being copper, which is applied using a conventional electro-less plating operation. Other means of applying the layers is possible, including, e.g., electrolytic plating. Layers 55 are shown in FIG. 5. Such plating may occur following a photolithographic processing step in which the outer conductive layers 23' and 45' are "circuitized" to form desired lines, pads, etc. (referenced by numerals 56) therein, in which case, the plating would result in "lands" formed on the outer conductive portions of layers 23' and 45' immediately adjacent the ends of openings 53. Such circuitization and plating will thus result in two contiguous pairs of "sub-layers" 23' and 57, and 45' and 57, on the respective opposed external surfaces. In such a case, the first sub-layer (that on the dielectric) is preferably comprised of the aforementioned copper or copper alloy material. The second sub-layer is also preferably copper or copper alloy. Third and fourth sub-layers (not shown for ease of illustration) of nickel and gold may also be added for enhanced conductivity purposes. The structure shown in FIG. 5 is now considered a finished circuitized substrate adapted for forming an electrical assembly or for its own implementation within and as part of an information handling system such as a personal computer, mainframe, server and the like. This substrate is also adaptable for use in many other systems, of course, and is not limited to information handling systems. Significantly, it is also adapted for being bonded to, e.g., laminated, other similar substrates and/or conductive and dielectric layers to form a multilayered structure such as a PCB having many conductive layers as part thereof.

For a more complex final product, the resulting circuitized substrate produced in accordance with the teachings herein may include more than three conductive planes as part thereof. It is possible, using the teachings of the invention, to produce a singular circuitized substrate having a plurality of internal signal, power and/or ground planes as part thereof. In such an embodiment, the structure formed as shown in FIG. 5 would include additional dielectric layers over the respective outer conductive layers. The embodiment of FIG. 5 is thus representative only and not limiting of the invention.

Figure 6:
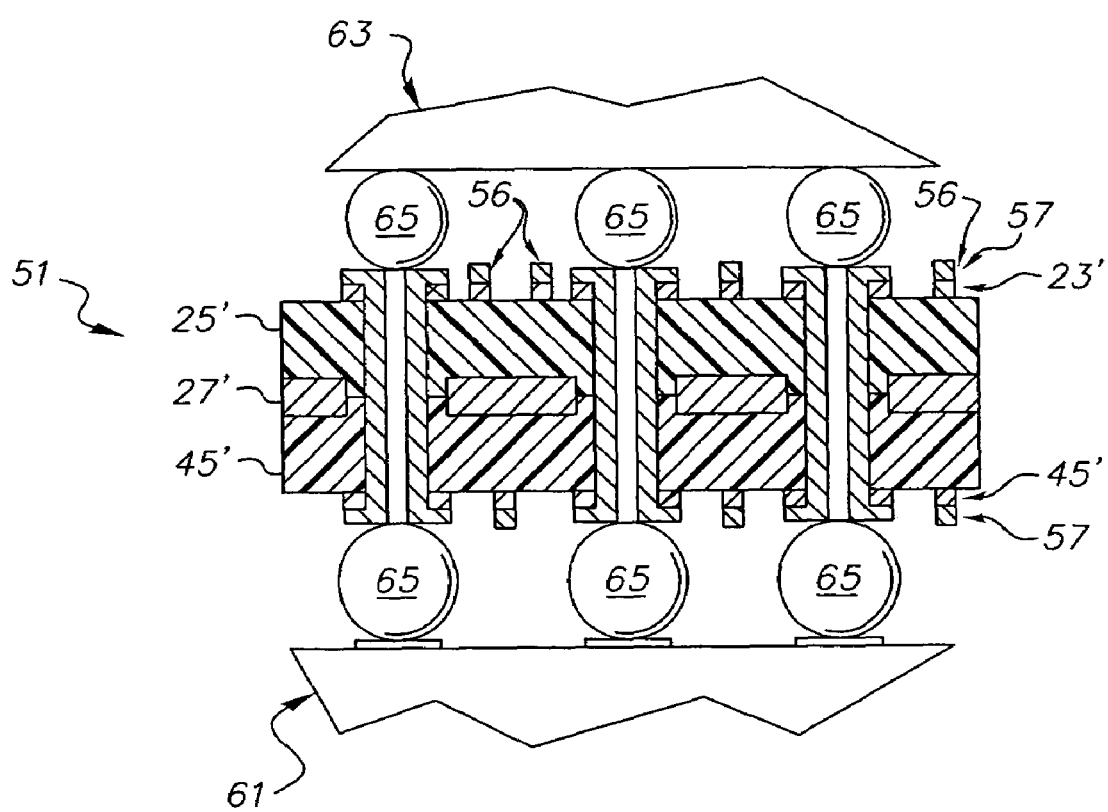
FIG. 6 is a side elevational view, also in section, illustrating an electrical assembly which can be made using the teachings of this invention, this assembly including a circuitized substrate such as shown in FIGS. 1-5.

In the embodiment of FIG. 6, the outer conductive layers of substrate 51 may be utilized to interconnect a pair of electronic structures, including, i.e., a larger PCB 61 and an electronic component 63 such as a semiconductor chip or even a chip carrier having one or more such chips therein. When substrate 51 includes one or more electronic components such as a semiconductor chip or chip carrier (having one or more chips as part thereof) mounted thereon and electrically coupled thereto, it understandably forms an electrical assembly. The same is true if the substrate is in the form of a chip carrier (having one or more chips thereon) and in turn is coupled to a lower substrate such as PCB 61. One known means for coupling these structures is to use a plurality of solder balls 65 as shown. Such chip carriers are produced and sold by the Assignee of the present invention, one such product referred to as a "Hyper-BGA" chip carrier, the term "Hyper-BGA" being a registered trademark of Endicott Interconnect Technologies, Inc. One example of a second electronic component 61, as stated, may be a PCB, several types of which are also produced and sold by the Assignee of the present invention. An electrical assembly formed in such a manner is then adapted for being positioned within a suitable housing (not shown) of such a personal computer, mainframe or server, as well as other systems known in the art, to form part of the system's electrical system. Means of accomplishing such positioning are well known in the assembly art and further description is not considered necessary.

Thus there has been shown and described a circuitized substrate which utilizes a pair of bonded sub-composite structures each comprised of at least one dielectric layer and at least one conductive layer, one of these including at least one second conductive layer. The formed composite uniquely enables the use of relatively thin interim conductive layers (e.g., that which may be a power plane in the final structure) due to the supportive construction of at least the sub-composite having the interim conductive layer thereon prior to the bonding. The product so formed may be produced using conventional PCB manufacturing equipment and processes, as mentioned above. The bonded structure may itself be a circuitized substrate or it may form a sub-composite adapted for being bonded, e.g., "stacked up" with other conductors and dielectrics, to form a larger structure.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:

forming a first sub-composite including a first dielectric layer of a partially cured dielectric material and having first and second electrically conductive layers positioned on opposite sides thereof, said second electrically conductive layer including a plurality of openings therein, said forming including bonding said first dielectric layer of said partially cured dielectric material and said first and second electrically conductive layers together at a temperature not sufficient to fully cure said partially cured dielectric material;

forming a second sub-composite including a second dielectric layer having a third electrically conductive layer positioned thereon;

aligning said first sub-composite having said first and second conductive layers positioned on said opposite sides of said first dielectric layer of said partially cured dielectric material and said second sub-composite such that said second electrically conductive layer of said first sub-composite including said plurality of openings therein faces said second dielectric layer of said second sub-composite;

bonding said first and second sub-composites together using pressure and heat sufficient to substantially fully cure said partially cured dielectric material of said first dielectric layer and also to cause said dielectric material of said first dielectric layer to substantially fill said plurality of openings within said second electrically conductive layer, said partially cured dielectric material of said first dielectric layer and said first conductive layer providing support for said second conductive layer during said bonding; and forming conductive openings within said bonded first and second sub-composites to provide electrical connections between selected ones of said first, second, and third conductive layers.

2. The method of claim 1 wherein said second dielectric layer is also of a partially cured dielectric material prior to said bonding of said first and second sub-composites.

3. The method of claim 1 wherein said openings within said second conductive layer are formed using an etching operation.

4. The method of claim 1 wherein said bonding of said first and second sub-composites together is accomplished utilizing a lamination process.

5. The method of claim 4 wherein said lamination process is conducted at a pressure within the range of from about 100 p.s.i. to about 1200 p.s.i. and at a temperature within the range of from about 180 degrees C. to about 220 degrees C.

6. The method of claim 1 further including circuitizing said first and third electrically conductive layers.

7. The method of claim 6 wherein said circuitizing is accomplished using photolithographic processing.

8. The method of claim 6 further including positioning an electrical component on said first electrically conductive layer and electrically coupling said electrical component to said first electrically conductive layer to form an electrical assembly.

9. The method of claim 8 further including providing a housing and positioning said electrical assembly within said housing to form an information handling system.

10. The method of claim 8 further including positioning said bonded first and second sub-composites on a second circuitized substrate and electrically coupling said bonded sub-composites to said second circuitized substrate.

11. The method of claim 1 wherein said forming of said conductive openings within said bonded first and second sub-composites to provide said electrical connections between said selected ones of said first, second and third conductive layers is accomplished using a plating operation.

12. The method of claim 11 wherein said plating operation is an electro-less plating operation.

* * * * *